(12) United States Patent
Mehkri et al.

(10) Patent No.: US 11,516,924 B2
(45) Date of Patent: Nov. 29, 2022

(54) PROTECTIVE HEAT SHIELDS FOR THERMALLY SENSITIVE COMPONENTS AND METHODS FOR PROTECTING THERMALLY SENSITIVE COMPONENTS

(71) Applicant: FLEX LTD, Singapore (SG)

(72) Inventors: Zohair Mehkri, San Jose, CA (US); Anwar Mohammed, San Jose, CA (US); Jesus Tan, San Jose, CA (US); David Geiger, Dublin, CA (US); Murad Kurwa, San Jose, CA (US)

(73) Assignee: FLEX LTD, Singapore (SG)

( * ) Notice: Subject to any disclaimer, the term of this patent is extended or adjusted under 35 U.S.C. 154(b) by 15 days.

(21) Appl. No.: 16/787,169

(22) Filed: Feb. 11, 2020

(65) Prior Publication Data

US 2020/0187364 A1 Jun. 11, 2020

Related U.S. Application Data

(62) Division of application No. 15/807,110, filed on Nov. 8, 2017, now Pat. No. 10,827,626.

(Continued)

(51) Int. Cl.
*H05K 3/34* (2006.01)
*H05K 3/00* (2006.01)
(Continued)

(52) U.S. Cl.
CPC ........... *H05K 3/3494* (2013.01); *B23K 1/008* (2013.01); *B23K 1/0016* (2013.01); *B23K 1/085* (2013.01);
(Continued)

(58) Field of Classification Search
CPC .... H05K 3/3494; H05K 3/0005; H05K 3/341; H05K 1/0201; H05K 1/181;
(Continued)

(56) References Cited

U.S. PATENT DOCUMENTS 5,735,450 A * 4/1998 Heim .................... B23K 1/012
228/232
5,913,552 A * 6/1999 McLellan ............. H05K 3/341
29/843

(Continued)

FOREIGN PATENT DOCUMENTS

WO WO-2007060661 A2 * 5/2007 ........... B23K 1/0016

*Primary Examiner* — Peter Dungba Vo
*Assistant Examiner* — Azm A Parvez
(74) *Attorney, Agent, or Firm* — Weber Rosselli & Cannon LLP

(57) ABSTRACT

A method of manufacturing a printed circuit board assembly includes providing a circuit board, positioning a plurality of components including at least one thermally-sensitive component having a maximum temperature threshold on the circuit board, positioning a customized protective heat shield on the thermally-sensitive component, exposing the circuit board (having the thermally-sensitive component disposed thereon and the customized protective heat shield disposed on the thermally-sensitive component) to a high-temperature environment wherein temperatures exceed the maximum temperature threshold of the thermally-sensitive component, and removing the customized protective heat shield from the thermally-sensitive component. Customized protective heat shields are also provided.

20 Claims, 4 Drawing Sheets

Related U.S. Application Data

(60) Provisional application No. 62/418,879, filed on Nov. 8, 2016.

(51) Int. Cl.

| | | |
|---|---|---|
| *H05K 1/18* | (2006.01) | |
| *F28F 13/00* | (2006.01) | |
| *B23K 3/08* | (2006.01) | |
| *F28F 21/06* | (2006.01) | |
| *B23K 1/008* | (2006.01) | |
| *B23K 1/08* | (2006.01) | |
| *B23K 1/20* | (2006.01) | |
| *B23K 1/00* | (2006.01) | |
| *H05K 1/02* | (2006.01) | |
| *B23K 101/42* | (2006.01) | |

(52) U.S. Cl.
CPC ............... *B23K 1/20* (2013.01); *B23K 3/085* (2013.01); *F28F 13/00* (2013.01); *F28F 21/06* (2013.01); *H05K 1/0201* (2013.01); *H05K 1/181* (2013.01); *H05K 3/0005* (2013.01); *H05K 3/341* (2013.01); *B23K 2101/42* (2018.08); *F28F 2270/00* (2013.01); *H05K 2201/10522* (2013.01); *H05K 2203/0195* (2013.01); *H05K 2203/044* (2013.01)

(58) Field of Classification Search
CPC ...... B23K 1/0016; B23K 1/008; B23K 1/085; B23K 1/20; Y10T 29/4913; Y10T 29/49124; Y10T 29/49117; Y10T 29/49002
USPC ............................... 29/832, 829, 825, 592.1
See application file for complete search history.

(56) References Cited

U.S. PATENT DOCUMENTS

| | | | |
|---|---|---|---|
| 6,059,170 A | * | 5/2000 | Jimarez ................ H05K 3/3494 228/264 |
| 9,900,988 B1 | * | 2/2018 | Chao ...................... H05K 3/284 |
| 2004/0012939 A1 | | 1/2004 | Ta et al. |
| 2011/0242764 A1 | | 10/2011 | Hill et al. |
| 2018/0013307 A1 | | 1/2018 | Pudipeddi |

* cited by examiner

PROTECTIVE HEAT SHIELDS FOR THERMALLY SENSITIVE COMPONENTS AND METHODS FOR PROTECTING THERMALLY SENSITIVE COMPONENTS

CROSS-REFERENCE TO RELATED APPLICATIONS

This application is a divisional of U.S. patent application Ser. No. 15/807,110, entitled "PROTECTIVE HEAT SHIELDS FOR THERMALLY SENSITIVE COMPONENTS AND METHODS FOR PROTECTING THERMALLY SENSITIVE COMPONENTS" and filed on Nov. 8, 2017, which claims the benefit of, and priority to, U.S. Provisional Patent Application No. 62/418,879, entitled "3D PRINTED PROTECTIVE HEAT SHIELDS FOR THERMALLY SENSITIVE COMPONENTS" and filed on Nov. 8, 2016, the entire contents of which are hereby incorporated herein by reference.

TECHNICAL FIELD

The present disclosure relates to Printed Circuit Board Assemblies (PCBAs) and, more specifically, to protective heat shields and methods for protecting thermally sensitive components during manufacture of PCBAs.

BACKGROUND

The process flow for manufacturing PCBAs including surface mount technology (SMT) components includes, among other steps, screen printing of solder paste, component pick and place, and reflow, wherein the circuit board being manufactured is passed through a reflow oven (or other suitable heating device) and exposed to high temperatures in order to melt the solder paste and permanently connect the SMT components to the circuit board.

The process flow for manufacturing PCBAs including pin-through-hole (PTH) components includes, among other steps, PTH component placement and wave soldering, wherein the circuit board being manufactured is passed through a wave soldering machine that exposes the underside of the circuit board to an upwelling of molten solder to permanently connect the PTH components to the circuit board. When passing through the wave solder machine, the circuit board is exposed to high temperatures.

The high temperature environments that the circuit board encounters during the reflow and/or wave soldering processes may include temperatures that rise above the maximum allowable temperatures of thermally sensitive components of the circuit board, potentially resulting in failure of these thermally sensitive components.

It would therefore be desirable to protect thermally sensitive components during reflow, wave soldering, and/or other high-temperature processes. It would be further advantageous to do so while minimizing costs and waste, without interfering with the assembly process, and without damaging or contaminating the PCBA.

SUMMARY

The present disclosure provides protective heat shields and methods that protect thermally sensitive components during reflow, wave soldering, and/or other high-temperature processes. The protective heat shields and methods of the present disclosure are also cost-effective and reusable, do not interfere with the assembly process, and avoid damaging or contaminating the PCBA. These and other aspects and features of the present disclosure are detailed below. To the extent consistent, any of the aspects and features described herein may be used in conjunction with any or all of the other aspects and features described herein.

Provided in accordance with the present disclosure is a method of manufacturing a printed circuit board assembly. The method includes providing a circuit board and positioning a plurality of components on the circuit board. At least one of the components is a thermally-sensitive component having a maximum temperature threshold. The method further includes positioning a customized protective heat shield on the thermally-sensitive component, exposing the circuit board (having the thermally-sensitive component disposed thereon and the customized protective heat shield disposed on the thermally-sensitive component) to a high-temperature environment wherein temperatures exceed the maximum temperature threshold of the thermally-sensitive component, and removing the customized protective heat shield from the thermally-sensitive component.

In an aspect of the present disclosure, the customized protective heat shield is positioned on the thermally-sensitive component prior to positioning of the thermally-sensitive component on the circuit board. In such aspects, the thermally-sensitive component and the customized protective heat shield may together be picked and placed on the circuit board with a surface mount technology machine.

In another aspect of the present disclosure, the customized protective heat shield is positioned on the thermally-sensitive component after positioning of the thermally-sensitive component on the circuit board.

In still another aspect of the present disclosure, positioning the customized protective heat shield on the thermally-sensitive component includes engaging the customized protective heat shield with the thermally-sensitive component.

In yet another aspect of the present disclosure, positioning the customized protective heat shield on the thermally-sensitive component includes receiving a connector of the thermally-sensitive component within an opening defined within the customized protective heat shield.

In still yet another aspect of the present disclosure, the customized protective heat shield is 3D printed and formed of a high temperature grade plastic.

In another aspect of the present disclosure, the customized protective heat shield is shaped complementary to at least a portion of the thermally-sensitive component.

In yet another aspect of the present disclosure, exposing the circuit board to a high temperature environment includes passing the circuit board through a reflow machine and/or passing the circuit board through a wave solder machine.

Another method of manufacturing a printed circuit board assembly provided in accordance with the present disclosure includes determining a configuration of a thermally-sensitive component, determining a layout of a circuit board upon which the thermally-sensitive component is to be positioned, creating a digital model file of a customized protective heat shield for the thermally-sensitive component based on the configuration of the thermally-sensitive component and the layout of the circuit board, 3D printing the customized protective heat shield from the digital model file, and assembling a first printed circuit board assembly. Assembling the first printed circuit board assembly includes positioning the thermally-sensitive component on the circuit board, positioning the customized protective heat shield on the thermally-sensitive component, exposing the circuit board (having the thermally-sensitive component disposed thereon and the customized protective heat shield disposed on the thermally-sensitive component) to a high-temperature environment, and removing the customized protective heat shield from the thermally-sensitive component.

In an aspect of the present disclosure, the method further includes assembling a second printed circuit board assembly reusing the customized protective heat shield.

In another aspect of the present disclosure, the customized protective heat shield is positioned on the thermally-sensitive component prior to positioning of the thermally-sensitive component on the circuit board. Alternatively, the customized protective heat shield is positioned on the thermally-sensitive component after positioning of the thermally-sensitive component on the circuit board.

In still another aspect of the present disclosure, determining the configuration of the thermally-sensitive component includes at least one of: determining a shape of the thermally-sensitive component, determining a position of a connector of the thermally-sensitive component, or determining a portion of the thermally-sensitive component capable of being engaged by the customized protective heat shield.

In yet another aspect of the present disclosure, 3D printing the customized protective heat shield from the digital model file includes at least one of: forming the customized protective heat shield to be complementary to at least a portion of the thermally-sensitive component, defining an opening in the customized protective heat shield to receive a connector of the thermally-sensitive component, or providing the customized protective heat shield with an engagement feature to engage the thermally-sensitive component.

In still yet another aspect of the present disclosure, the customized protective heat shield is 3D printed from a high temperature grade plastic.

An assembly during manufacture of a printed circuit board assembly provided in accordance with the present disclosure includes a circuit board, a plurality of components on the circuit board, and a customized protective heat shield. At least one of the components is a thermally-sensitive component having a maximum temperature threshold. The customized protective heat shield is removably disposed on the thermally-sensitive component, surrounds at least a portion of the thermally-sensitive component, and is shaped complementary to at least a portion of the thermally-sensitive component. The customized protective heat shield is configured to thermally insulate the thermally-sensitive component from a high-temperature environment having temperatures above the maximum temperature threshold such that a temperature of the thermally-sensitive component is maintained below the maximum temperature threshold.

In an aspect of the present disclosure, the customized protective heat shield is 3D printed and formed of a high temperature grade plastic.

In another aspect of the present disclosure, the customized protective heat shield includes an engagement finger configured to engage a portion of the thermally-sensitive component.

In another aspect of the present disclosure, the customized protective heat shield defines an opening configured to receive a connector of the thermally-sensitive component.

BRIEF DESCRIPTION OF THE DRAWINGS

Various aspects and features of the present disclosure are described hereinbelow with reference to the drawings wherein like numerals designate similar elements in each of the several views and.

DETAILED DESCRIPTION

Figure 1A:
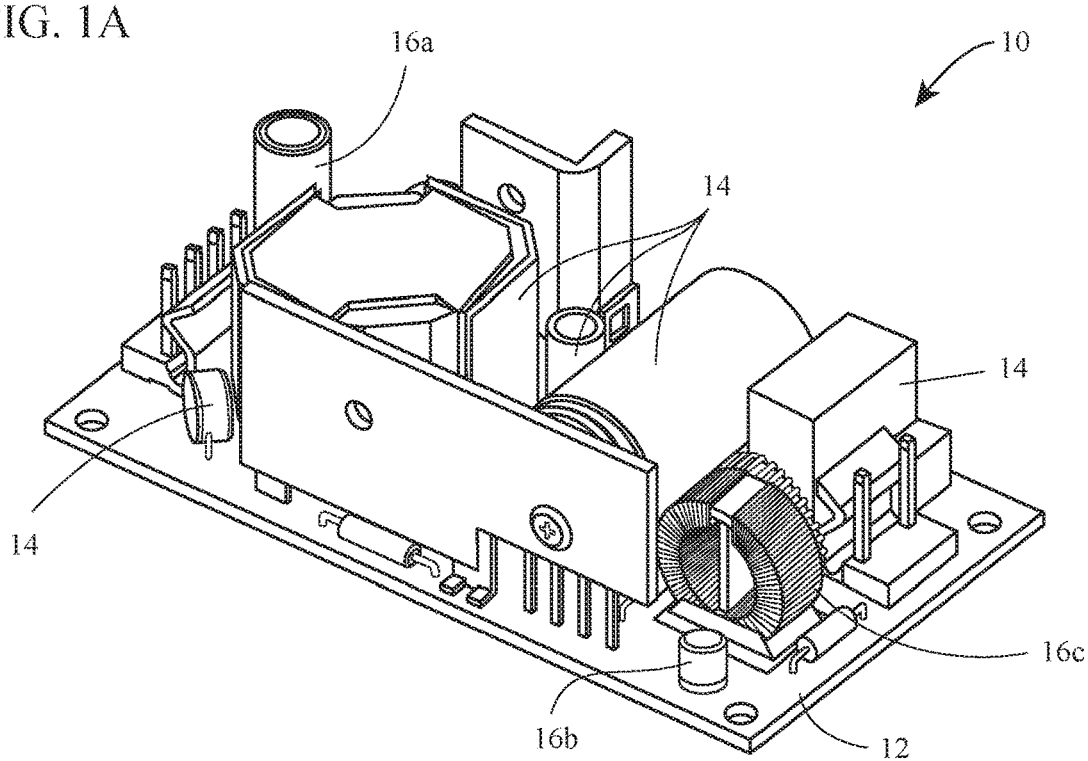
FIG. 1A is a perspective view of an exemplary PCBA including thermally sensitive components.
Figure 1B:
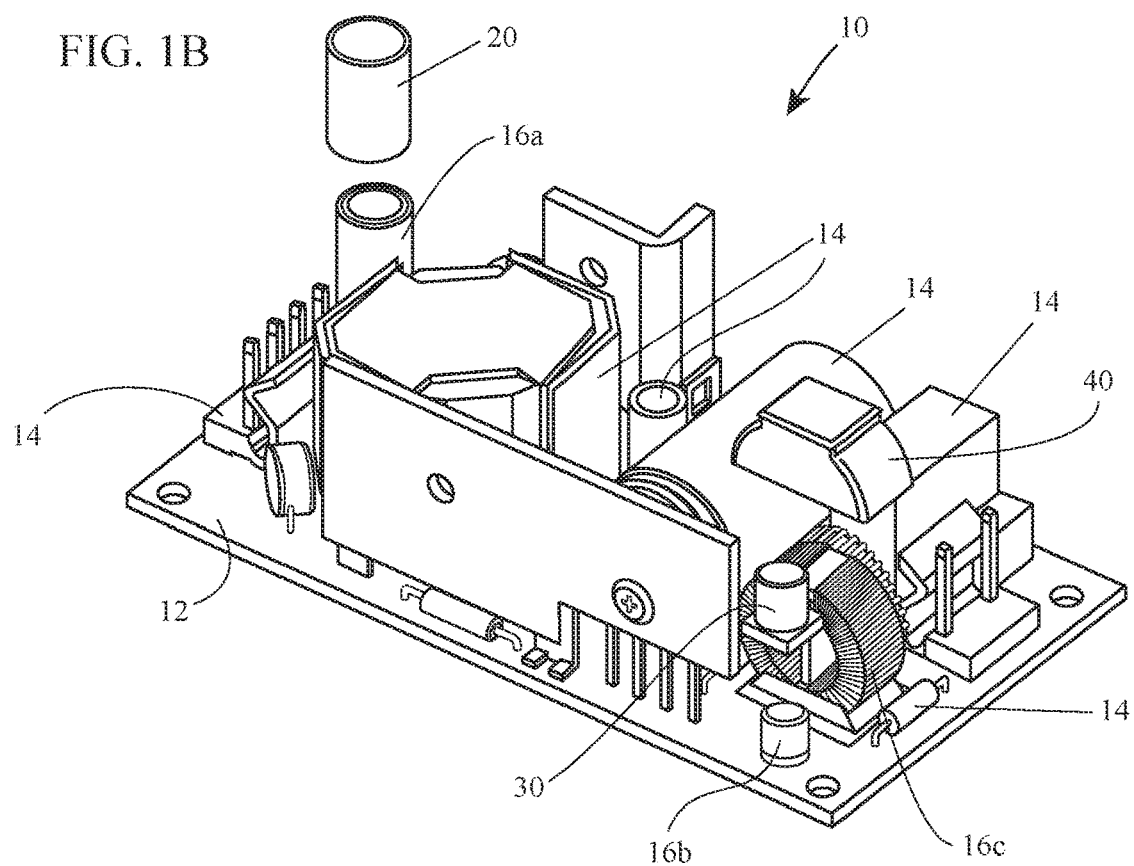
FIG. 1B is an exploded, perspective view illustrating the PCBA of FIG. 1A and protective heat shields for use therewith to protect the thermally sensitive components thereof.

Turning to FIGS. 1A and 1B, a Printed Circuit Board Assembly (PCBA) is shown generally identified by reference numeral 10. PCBA 10 generally includes a circuit board 12 and a plurality of components 14 operably disposed on circuit board 12. Some or all of the components 14 may be Surface Mount Technology (SMT) components engaged on circuit board 12 via an SMT process. Alternative or additionally, some or all of the components 14 may be Pin-Through-Hole (PTH) components engaged on circuit board 12 via a PTH process. At least some of the components 14 are thermally-sensitive components 16a, 16b, 16c, components that may fail when exposed to high temperatures, e.g., temperatures exceeding 250° C. or other temperature threshold. Such thermally-sensitive components include, but are not limited to, e.g., capacitors, fuses, inductors and transformers with wire coils, non-solid state relays, LED's, and Surface Mount Technology (SMT) connectors. Although one configuration of a PCBA 10 is shown in FIGS. 1A and 1B, it is understood that the aspects and features of the present disclosure apply equally to any PCBA including one or more thermally-sensitive components.

Continuing with reference to FIGS. 1A and 1B, as can be appreciated, thermally-sensitive components 16a, 16b, 16c may define various different configurations and surroundings, depending upon the particular component, its position on circuit board 12 relative to the other components 14, the method by which it is engaged on circuit board 12, e.g., an SMT process or a PTH process, and/or other factors. For example, a first thermally-sensitive component 16a may define a relatively tall, relatively small-diametered cylindrical configuration; a second thermally-sensitive component 16b may define a relatively short, relatively large-diametered cylindrical configuration including a base platform upon which the cylinder is disposed; and a third thermally-sensitive component 16c may define a ring-shaped configuration. As detailed below, protective heat shields 20, 30, 40 (FIG. 1B) provided in accordance with the present disclosure are customized to one or more thermally-sensitive components 16a, 16b, 16c, respectively, and the surroundings thereof to enable protective heat shields 20, 30, 40 to protect, e.g., thermally insulate, thermally-sensitive components 16a, 16b, 16c, respectively, during high-temperature manufacturing steps, e.g., reflow and/or wave soldering.

Although various features of protective heat shields 20, 30, 40 are detailed below with respect to a particular protective heat shield 20, 30, 40, it is understood that any suitable heat shield having any suitable combination of features may be provided, depending upon a particular purpose. Further, although protective heat shields 20, 30, 40 are detailed herein as corresponding to thermally-sensitive components 16a, 16b, 16c, respectively, it is also contemplated that a protective heat shield may correspond to two-or more thermally-sensitive or other components, such as, for example, where multiple thermally-sensitive components are in close proximity, where the location of the thermally-sensitive components or other components necessitates use of a common protective heat shield, and/or in other instances.

Figure 2:
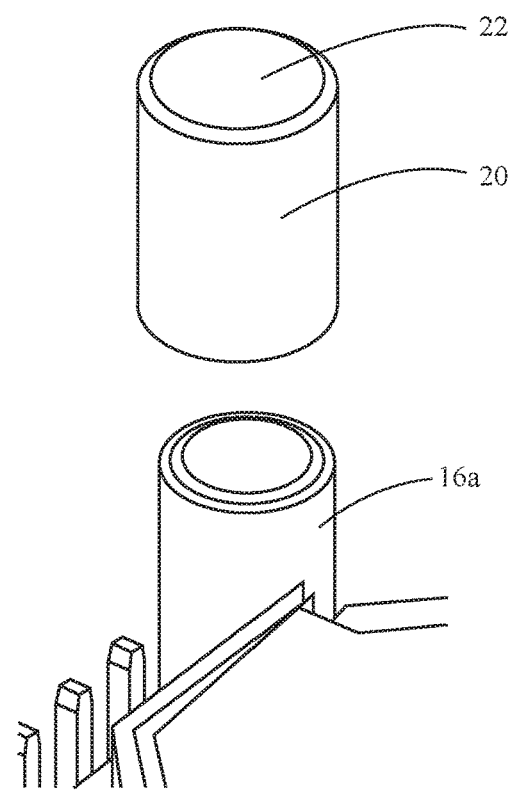
FIG. 2 is an enlarged, exploded, perspective view of a portion of the PCBA of FIG. 1A illustrating a first protective heat shield for use with a first thermally sensitive component of the PCBA.

Referring to FIG. 2, in conjunction with FIGS. 1A and 1B, in order to protect first thermally-sensitive component 16a, first protective heat shield 20 is provided. First protective heat shield 20 is manufactured via 3D printing, which enables first protective heat shield 20 to be customized to first thermally-sensitive component 16a and the surroundings thereof without the need for tooling or other component-specific manufacturing equipment. First protective heat shield 20, more specifically, may be 3D printed from a digital model file designed based upon the configuration of first thermally-sensitive component 16a, the surroundings thereof, and the desired properties and/or features of first protective heat shield 20. As can be appreciated, by 3D printing first protective heat shield 20, complex geometries and/or configurations may be provided, thus enabling first protective heat shield 20 to be configured for almost any thermally-sensitive component(s), board configurations, features, and/or properties. First protective heat shield 20, for example, may be formed from a relatively light weight, high-temperature grade 3D printing material, e.g., a high-temperature grade plastic, and may define a configuration complementary to first thermally-sensitive component 16a, e.g., a relatively tall, relatively small-diametered cylindrical configuration, such that first protective heat shield 20 can encompass first thermally-sensitive component 16a therein without interfering with surrounding components.

First protective heat shield 20 may further include a pick-up area 22 enabling first protective heat shield 20 to be picked and placed by an SMT machine during manufacture of PCBA 10. First protective heat shield 20 may be picked and placed together with first thermally-sensitive component 16a or separately therefrom. First protective heat shield 20 may alternatively be positioned on first thermally-sensitive component 16a in any other suitable manner, and/or first thermally-sensitive component 16a may be a PTH component or other suitable component.

Figure 3:
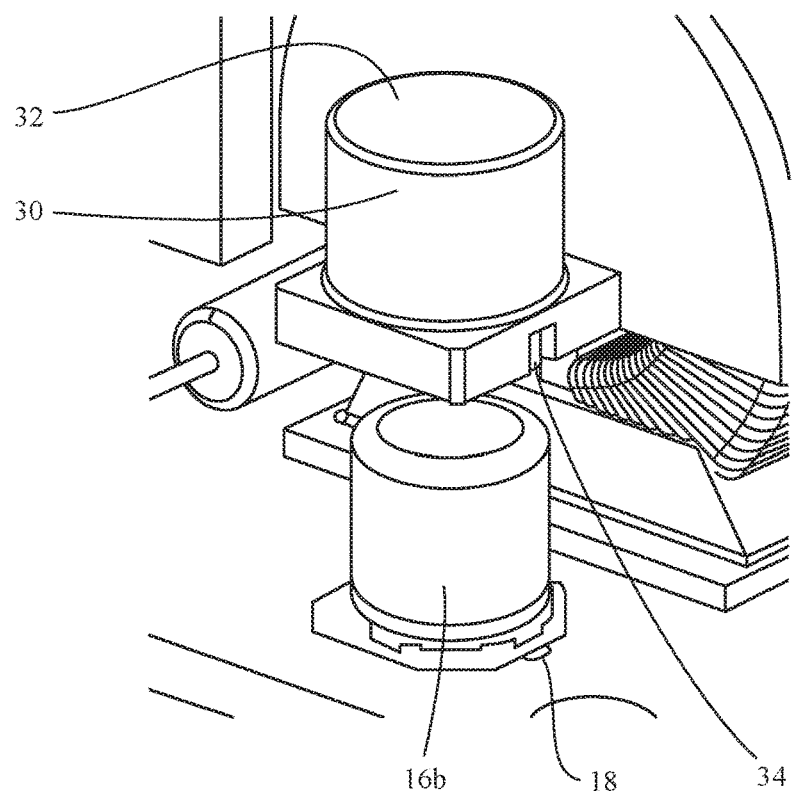
FIG. 3 is an enlarged, exploded, perspective view of a portion of the PCBA of FIG. 1A illustrating a second protective heat shield for use with a second thermally sensitive component of the PCBA.

Referring to FIG. 3, in conjunction with FIGS. 1A and 1B, in order to protect second thermally-sensitive component 16b, second protective heat shield 30 is provided. Second protective heat shield 30 is manufactured via 3D printing, which enables second protective heat shield 30 to be customized to second thermally-sensitive component 16b and the surroundings thereof without the need for tooling or other component-specific manufacturing equipment, similarly as detailed above with respect to first protective heat shield 20 (FIG. 2). Second protective heat shield 30, for example, may be formed from a relatively light weight, high-temperature grade 3D printing material, e.g., a high-temperature grade plastic, and may define a configuration complementary to second thermally-sensitive component 16b, e.g., a relatively short, relatively large-diametered cylindrical configuration including a base platform upon which the cylinder is disposed, such that second protective heat shield 30 can encompass second thermally-sensitive component 16b therein without interfering with surrounding components or connections.

Second protective heat shield 30 may further include a pick-up area 32, similarly as detailed above with respect to first protective heat shield 20 (FIG. 2). Second protective heat shield 30 may additionally or alternatively define one or more cut-outs 34 configured to receive one or more connections 18 (or other features) associated with second thermally-sensitive component 16b such that the connections 18 (or other features) are not damaged upon placement of second protective heat shield 30 about second thermally-sensitive component 16b.

Figure 4A:
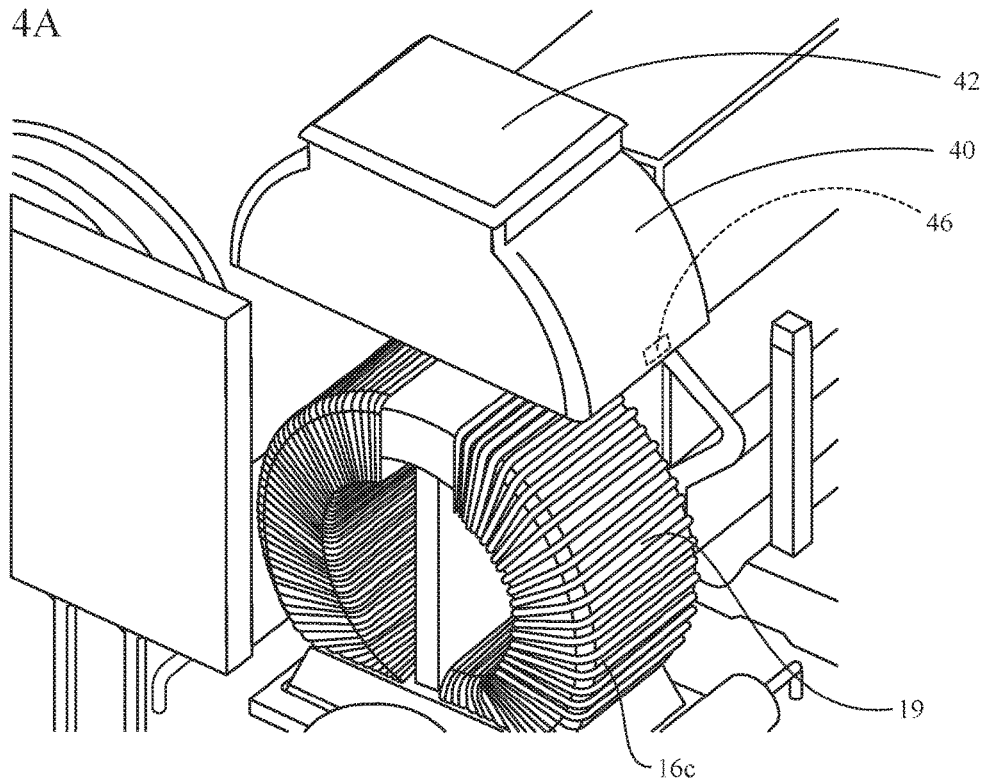
FIG. 4A is an enlarged, exploded, perspective view of a portion of the PCBA of FIG. 1A illustrating a third protective heat shield for use with a third thermally sensitive component of the PCBA.
Figure 4B:
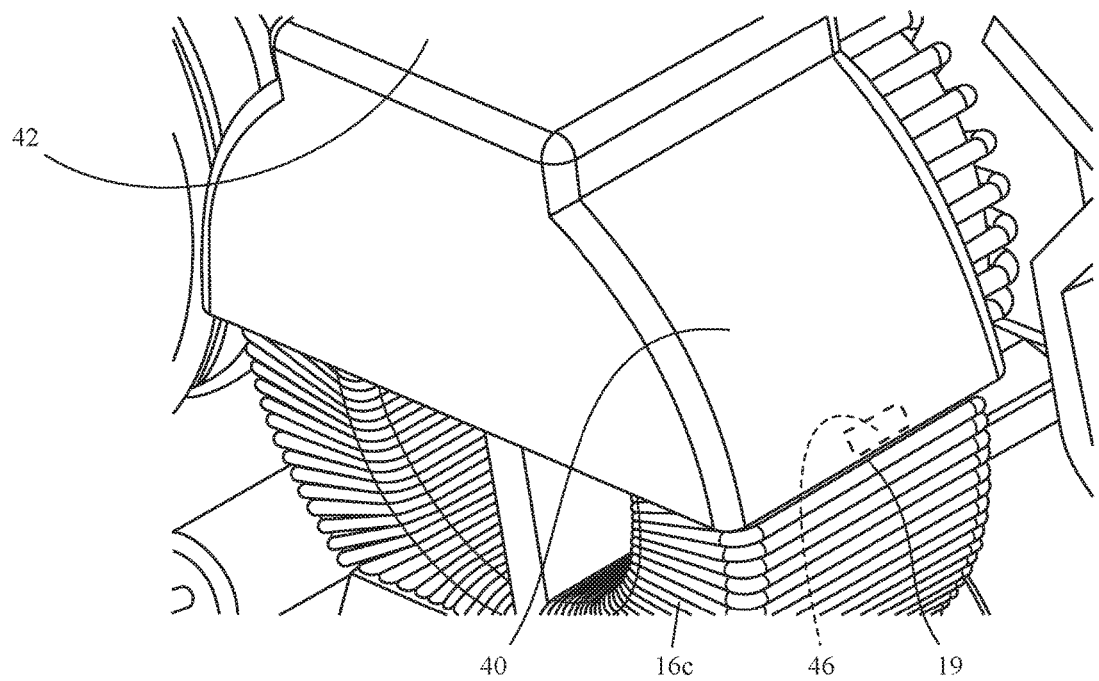
FIG. 4B is an enlarged, perspective view of the portion of the PCBA of FIG. 1A illustrated in FIG. 4A, wherein the third protective heat shield is engaged with the third thermally sensitive component.

Referring to FIGS. 4A and 4B, in conjunction with FIGS. 1A and 1B, in order to protect third thermally-sensitive component 16c, third protective heat shield 40 is provided. Third protective heat shield 40 is manufactured via 3D printing, which enables third protective heat shield 40 to be customized to third thermally-sensitive component 16c and the surroundings thereof without the need for tooling or other component-specific manufacturing equipment, similarly as detailed above with respect to first protective heat shield 20 (FIG. 2). Third protective heat shield 40, for example, may be formed from a relatively light weight, high-temperature grade 3D printing material, e.g., a high-temperature grade plastic, and may define a configuration complementary to a portion of third thermally-sensitive component 16c, e.g., defining a semi-disc-shaped configuration, such that third protective heat shield 40 can encompass a portion of third thermally-sensitive component 16c therein without interfering with surrounding components or connections.

Third protective heat shield 40, as detailed above and as illustrated in FIGS. 4A and 4B, is configured to cover only a portion of third thermally-sensitive component 16c. In certain instances, such as with respect to third protective heat shield 40 and third thermally-sensitive component 16c, the protective heat shield need not fully surround the thermally-sensitive component(s) in order to protect, e.g., thermally insulate, the thermally-sensitive component(s) from high temperature environments.

Third protective heat shield 40 may further include a pick-up area 42, similarly as detailed above with respect to first protective heat shield 20 (FIG. 2). Third protective heat shield 40 may additionally or alternatively include one or more engagement fingers 46, each configured to engage a corresponding opening 19, e.g., slot, aperture, recess, other opening, etc., defined within third thermally-sensitive component 16c such that the third protective heat shield 40 may be releasably engaged with third thermally-sensitive component 16c. The one or more engagement fingers 46 may be in the form of a tab, hook, protrusion, or other suitable structure capable of releasably engaging the corresponding opening(s) 19 of third thermally-sensitive component 16c to maintain third protective heat shield 40 in position about third thermally-sensitive component 16c.

Referring generally to FIGS. 1A and 1B, as demonstrated above, various different configurations of protective heat shields 20, 30, 40 may be provided. However, the present disclosure is not limited to those configurations of protective heat shields 20, 30, 40 detailed above. Rather, protective heat shields 20, 30, 40 are merely examples of protective heat shields capable of being manufactured via 3D printing. Of course, any suitable customized protective heat shield based upon particular thermally-sensitive component(s), board configuration, feature(s), and/or property(s) can be manufactured via 3D printing as needed. Thus, at the design stage of a manufacturing project, once the particular thermally-sensitive and other components to be utilized are determined, and one the layout of the circuit board is determined, digital model files (e.g., created on a general purpose computer with suitable CAD software) of appropriate protective heat shield(s) can be customized to the thermally-sensitive component(s) and board layout. More specifically, as demonstrated in the above-exemplary embodiments, each protective heat shield can be designed complementary to at least a portion of the thermally-sensitive component(s) it is to protect, can be designed with features to inhibit damage to connectors of the thermally-sensitive component(s) and surrounding components, can be designed with features to enable the protective heat shield to engage the thermally-sensitive component(s), can be designed to enable positioning about the thermally-sensitive component(s) without interfering with surrounding components, can be designed to include features facilitating pick and placement thereof, and can be designed to include any other desired feature(s) and/or property(s), thus enabling 3D printing of protective heat shields that meet the exact needs of the particular manufacturing project.

In addition, various different materials may be utilized for 3D printing or otherwise incorporated into the resultant protective heat shield to achieve a desired property throughout or on certain portions of the protective heat shield. For example, conductive material may be incorporated into the protective heat shield to make the protective heat shield at least partially conductive; reinforcing material may be incorporated into the protective heat shield to make the protective heat shield stronger in certain areas; higher heat-resistant material may be incorporated into the protective heat shield to increase the thermal protection of the protective heat shield in certain areas; etc.

Figure 5:
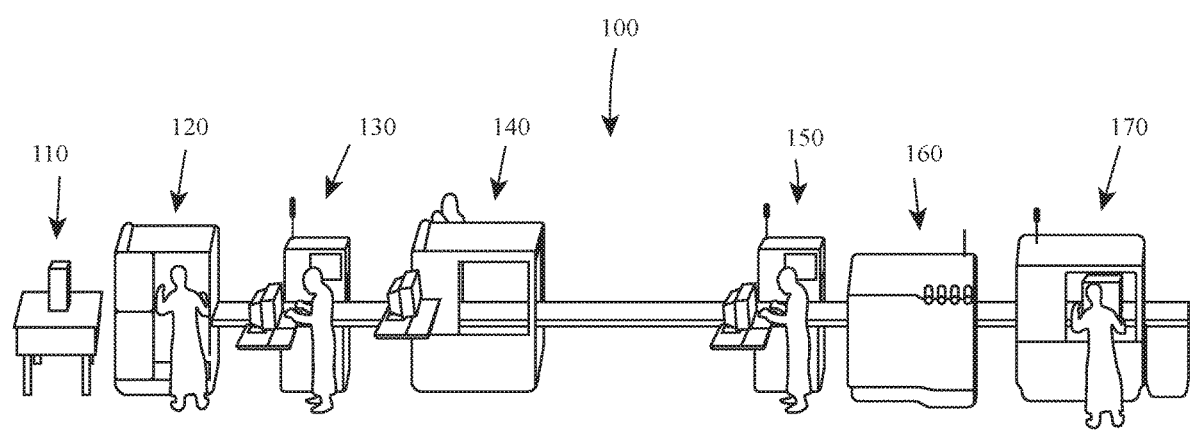
FIG. 5 is a schematic drawing of a portion of an assembly line illustrating a portion of a PCBA manufacturing process flow.

Turning now to FIG. 5, in conjunction with FIGS. 1A and 1B, a portion of an assembly line 100 for the manufacture of PCBAs, e.g., PCBA 10, is illustrated. Assembly line 100 includes a board loading station 110, a solder screen printing station 120, a solder paste inspection station 130, a pick and place station 140, an automatic optical inspection station 150, a reflow station 160, and a plurality of additional stations 170 (only one of which is illustrated). At the board loading station 110, the circuit board 12 is loaded on the assembly line 100. At the solder screen printing station 120, solder paste is applied, and at the solder paste inspection station 130, the solder paste is inspected.

At the pick and place station 140, the components 14 that are SMT components are positioned on the circuit board 12 via an SMT machine. At the pick and place station 140, the thermally-sensitive components 16a, 16b, 16c may already include the respective protective heat shields 20, 30, 40 engaged thereon such that the thermally-sensitive component and protective heat shield pairs 16a and 20, 16b and 30, 16c and 40, are together moved into position on the circuit board 12 via the SMT machine at the pick and place station 140. Alternatively, the pick and place station 140 may include separate machinery, or may be configured such that the SMT machine operates sequentially to first load the components 14 that are SMT components onto the circuit board 12, and thereafter engage the protective heat shields 20, 30, 40 on the thermally-sensitive components 16a, 16b, 16c, respectively. As another alternative, a separate station may be provided for positioning the protective heat shields 20, 30, 40 on the thermally-sensitive components 16a, 16b, 16c.

At the automatic optical inspection station 150, the PCBA 10 is scanned for failures and defects. At the reflow station 160, the PCBA 10 enters a reflow oven (or other suitable heating device) and is exposed to high temperatures in order to melt the solder paste and permanently connect the components 14 that are SMT components to the circuit board 12. Protective heat shields 20, 30, 40, disposed on the corresponding thermally-sensitive components 16a, 16b, 16c protect these components 16a, 16b, 16c from the high temperature environment of the reflow oven, thus preventing failure of these components 16a, 16b, 16c.

Once the PCBA 10 exits the reflow station 160, the assembly line 100 proceeds to the plurality of additional stations 170. If no further high-temperature environments are encountered, one of the plurality of additional stations 170 may include removing the protective heat shields 20, 30, 40. Alternatively, if further high-temperature environments are encountered, such as within a wave solder machine, the protective heat shields 20, 30, 40 are left in position until the PCBA 10 completes the stations where high-temperature environments are encountered.

The plurality of additional stations 170 may include, for example, a PTH placement station and a wave solder station (or assembly line 100 may include a PTH placement station and a wave solder station in place of the SMT pick and place and reflow stations detailed above). In such configurations, protective heat shields may be placed on temperature-sensitive PTH components before placement on the circuit board 12 such that the temperature-sensitive PTH components and their protective heat shields are together placed on the circuit board 12, or may be placed on the temperature-sensitive PTH components after the temperature-sensitive PTH components have already been positioned on the circuit board 12. Similarly as above, the protective heat shields are removed once the PCBA 10 completes all the stations where high-temperature environments are encountered.

Since the protective heat shields are removed prior to completion of manufacturing, contamination of the PBCA is avoided. Once removed, the protective heat shields may be reused in the manufacture of subsequent PCBAs, similarly as detailed above.

Persons skilled in the art will understand that the structures and methods specifically described herein and shown in the accompanying figures are non-limiting exemplary embodiments, and that the description, disclosure, and figures should be construed merely as exemplary of particular embodiments. It is to be understood, therefore, that the present disclosure is not limited to the precise embodiments described, and that various other changes and modifications may be affected by one skilled in the art without departing from the scope or spirit of the disclosure. Additionally, the elements and features shown or described in connection with certain embodiments may be combined with the elements and features of certain other embodiments without departing from the scope of the present disclosure, and that such modifications and variations are also included within the scope of the present disclosure. Accordingly, the subject matter of the present disclosure is not limited by what has been particularly shown and described.

What is claimed is:

1. A method of manufacturing a printed circuit board assembly, the method comprising:

providing a circuit board;

positioning a plurality of components on the circuit board, at least one of the components being a thermally-sensitive component having a maximum temperature threshold;
positioning a customized protective heat shield on the thermally-sensitive component, wherein the customized protective heat shield covers the thermally-sensitive component but exposes non-thermally-sensitive components of the plurality of components on the circuit board;
exposing the circuit board, the plurality of components, and the customized protective heat shield to a high-temperature environment wherein temperatures exceed the maximum temperature threshold of the thermally-sensitive component; and
removing the customized protective heat shield from the thermally-sensitive component.

2. The method according to claim 1, wherein the customized protective heat shield is positioned on the thermally-sensitive component prior to positioning of the thermally-sensitive component on the circuit board.

3. The method according to claim 2, wherein the thermally-sensitive component and the customized protective heat shield are together picked and placed on the circuit board with a surface mount technology machine.

4. The method according to claim 1, wherein the customized protective heat shield is positioned on the thermally sensitive component after positioning of the thermally-sensitive component on the circuit board.

5. The method according to claim 1, wherein positioning the customized protective heat shield on the thermally-sensitive component includes engaging the customized protective heat shield with the thermally-sensitive component.

6. The method according to claim 1, wherein positioning the customized protective heat shield on the thermally sensitive component includes receiving a connector of the thermally-sensitive component within an opening defined within the customized protective heat shield.

7. The method according to claim 1, wherein the customized protective heat shield is 3D printed and formed of a high temperature grade plastic.

8. The method according to claim 1, wherein the customized protective heat shield is shaped complementary to at least a portion of the thermally-sensitive component.

9. The method according to claim 1, wherein exposing the circuit board to a high temperature environment includes at least one of: passing the circuit board through a reflow machine or passing the circuit board through a wave solder machine.

10. A method of manufacturing a printed circuit board assembly, comprising:
positioning a plurality of components on a circuit board, at least one of the components being a thermally-sensitive component having a maximum temperature threshold;
positioning a protective heat shield on the thermally-sensitive component, wherein the protective heat shield covers the thermally-sensitive component but exposes non-thermally-sensitive components of the plurality of components on the circuit board;
exposing the circuit board, the plurality of components, and the protective heat shield to a high temperature environment wherein temperatures exceed the maximum temperature threshold of the thermally-sensitive component; and
removing the protective heat shield from the thermally-sensitive component.

11. The method according to claim 10, wherein the heat shield is positioned on the thermally-sensitive component prior to positioning of the thermally-sensitive component on the circuit board.

12. The method according to claim 11, wherein the thermally-sensitive component and the protective heat shield are together picked and placed on the circuit board with a surface mount technology machine.

13. The method according to claim 10, wherein the protective heat shield is positioned on the thermally-sensitive component after positioning of the thermally-sensitive component on the circuit board.

14. The method according to claim 10, wherein positioning the protective heat shield on the thermally-sensitive component includes engaging the protective heat shield with the thermally-sensitive component.

15. The method according to claim 10, wherein positioning the protective heat shield on the thermally-sensitive component includes receiving a connector of the thermally-sensitive component within an opening defined within the customized protective heat shield.

16. The method according to claim 10, wherein the protective heat shield is 3D printed and formed of a high temperature grade plastic.

17. The method according to claim 10, wherein the protective heat shield is shaped complementary to at least a portion of the thermally-sensitive component.

18. A method of manufacturing a printed circuit board assembly, comprising:
positioning a plurality of components on a circuit board, at least one of the components being a thermally-sensitive component having a maximum temperature threshold;
positioning a protective heat shield on the thermally-sensitive component, the protective heat shield conforming to a shape of a portion of the thermally-sensitive component, wherein the protective heat shield covers the thermally-sensitive component but exposes non-thermally sensitive components of the plurality of components on the circuit board;
exposing the circuit board, the plurality of components, and the protective heat shield to a high temperature environment wherein temperatures exceed the maximum temperature threshold of the thermally-sensitive component; and
removing the protective heat shield from the thermally-sensitive component.

19. The method according to claim 18, wherein the heat shield is positioned on the thermally-sensitive component prior to positioning of the thermally-sensitive component on the circuit board.

20. The method according to claim 18, wherein the protective heat shield is positioned on the thermally-sensitive component after positioning of the thermally-sensitive component on the circuit board.

\* \* \* \* \*